US012593597B2

(12) United States Patent
Choi et al.

(10) Patent No.: US 12,593,597 B2
(45) Date of Patent: Mar. 31, 2026

(54) DISPLAY DEVICE

(71) Applicant: SAMSUNG DISPLAY CO., LTD.,
Yongin-si (KR)

(72) Inventors: Chul Hyun Choi, Cheonan-si (KR);
Hyun Gue Song, Hwaseong-si (KR);
Min Jae Kim, Yongin-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 615 days.

(21) Appl. No.: 17/660,562

(22) Filed: Apr. 25, 2022

(65) Prior Publication Data

US 2022/0376208 A1      Nov. 24, 2022

(30) Foreign Application Priority Data

May 24, 2021      (KR) ........................ 10-2021-0066315

(51) Int. Cl.
H10K 59/80          (2023.01)
(52) U.S. Cl.
CPC ......... H10K 59/873 (2023.02); H10K 59/879
(2023.02)
(58) Field of Classification Search
CPC .............. H10K 50/844; H10K 50/858; H10K
50/8445; H10K 50/805; H10K 59/873;
H10K 59/879; H10K 2102/351
See application file for complete search history.

(56) References Cited

U.S. PATENT DOCUMENTS

| | | | |
|---|---|---|---|
| 9,627,647 B2 | 4/2017 | Kim et al. | |
| 9,966,567 B2 | 5/2018 | Kim et al. | |
| 10,553,651 B2 | 2/2020 | Yim et al. | |
| 11,217,773 B2 | 1/2022 | Song et al. | |
| 11,943,959 B2 | 3/2024 | Song et al. | |
| 2016/0315290 A1* | 10/2016 | Zhang | .................... H10D 86/40 |
| 2018/0013100 A1* | 1/2018 | Yim | .................. H10K 50/8445 |
| 2019/0043931 A1* | 2/2019 | Yim | .................... H10K 50/858 |
| 2019/0067627 A1* | 2/2019 | Jia | ........................ H10K 50/858 |
| 2020/0357871 A1* | 11/2020 | Chung | ................ H10K 59/879 |
| 2020/0381665 A1* | 12/2020 | Song | .................. H10K 59/879 |
| 2024/0276761 A1 | 8/2024 | Song et al. | |

FOREIGN PATENT DOCUMENTS

| | | |
|---|---|---|
| KR | 10-2006-0032089 | 4/2006 |
| KR | 10-2014-0033867 | 3/2014 |
| KR | 10-2016-0036722 A | 4/2016 |
| KR | 10-2018-0016694 | 2/2018 |
| KR | 10-2018-0051702 | 6/2018 |
| KR | 10-2019-0015682 A | 2/2019 |
| KR | 10-2020-0136552 A | 12/2020 |

OTHER PUBLICATIONS

Office Action dated Nov. 30, 2024, in corresponding Korean Patent
Application No. 10-2021-0066315, 7 pages.

* cited by examiner

*Primary Examiner* — Shaun M Campbell
(74) *Attorney, Agent, or Firm* — F. CHAU &
ASSOCIATES, LLC

(57)          ABSTRACT

A display device comprises a substrate; a light emitting
element disposed on the substrate; a first layer disposed on
the light emitting element, a second layer disposed on the
first layer; and an encapsulation layer disposed on the
second layer. The first layer has a first refractive index, the
second layer has a second refractive index, the first refrac-
tive index is from 1.7 to 2.2, and the second refractive index
is from 1.25 to 1.45.

21 Claims, 9 Drawing Sheets

FIG. 3

DISPLAY DEVICE

CROSS-REFERENCE TO RELATED APPLICATION

This application claims priority under 35 U.S.C. 119 from Korean Patent Application No. 10-2021-0066315, filed on May 24, 2021 in the Korean Intellectual Property Office, the contents of which are herein incorporated b reference in their entirety.

TECHNICAL FIELD

Embodiments of the present disclosure are directed to a display device.

DISCUSSION OF THE RELATED ART

Display devices have recently acquired many new uses. As display device become thinner and lighter, they become more widely used, and studies for new uses of display devices are ongoing.

A display device includes light emitting elements and an encapsulation member that encapsulates the light emitting elements to protect the light emitting elements from the external air or moisture.

A front emission type display device emits light from the light emitting elements (or display elements) a user through a thin film encapsulation layer, and changes in visibility based on a user's viewing, angle occur depending on a structure of the thin film encapsulation layer through which light passes. In detail, during full light emission, light that is visible should be white. During full light emission and based on the structure of the thin film encapsulation layer, a change in visibility may occur due to another non-white color, and this change in visibility is more noticeable as the viewing angle increases.

SUMMARY

An embodiment of the present disclosure provides a display device in which a change in visibility based on a user's viewing angle that is caused by a structure of a thin film encapsulation layer is reduced.

A display device according to an embodiment comprises a substrate; a light emitting element disposed on the substrate; a first layer disposed on the light emitting element, a second layer disposed on the first layer; and an encapsulation layer disposed on the second layer. The first layer has a first refractive index, the second layer has a second refractive index, the first refractive index is from 1.7 to 2.2, and the second refractive index is from 1.25 to 1.45.

A display device according to an embodiment comprises a substrate; a light emitting element disposed on the substrate; a first layer disposed on the light emitting element, a second layer disposed on the first layer; and an encapsulation layer disposed on the second layer. The light emitting element includes a first electrode disposed on the substrate, an organic layer disposed on the first electrode, and a second electrode disposed on the organic layer. The first layer has a first refractive index, the second layer has a second refractive index, and the first refractive index is greater than the second refractive index. The second electrode has a first thickness, the first layer has a second thickness, the second layer has a third thickness, the first thickness is from 750 nm to 1150 nm, the second thickness is from 5000 nm to 15000 nm, and the third thickness is between 2000 nm and 6000 nm A display device according to an embodiment comprises a substrate; a light emitting element disposed on the substrate; a first layer disposed on the light emitting element, a second layer disposed on the first layer; and an encapsulation layer on the second layer. The encapsulation layer includes a lower inorganic encapsulation layer disposed on the second layer, an organic encapsulation layer disposed on the lower inorganic encapsulation layer, and an upper inorganic encapsulation layer disposed on the organic encapsulation layer. On color coordinates of a CIE diagram where a variation $\Delta u'$ of a first component of light emitted from the light emitting element through the first layer, the second layer and the encapsulation layer is a horizontal axis, a variation $\Delta v'$ of a second component of light emitted from the light emitting element through the first layer, the second layer and the encapsulation layer is a vertical axis, and each of the variation $\Delta u'$ of the first component and the variation $\Delta v'$ of the second component in a square one is zero, each of the variation $\Delta u'$ of the first component and the variation $\Delta v'$ of the second component has a negative value at viewing angles of 30°, 45° and 60°, the variation $\Delta u'$ of the first component and the variation $\Delta v'$ of the second component decrease when the color coordinates are sequentially measured at a viewing angle from 0° to 30° and a viewing angle from 30° to 45°, and the variation $\Delta u'$ of the first component and the variation $\Delta v'$ of the second component increase when the color coordinates are measured at a viewing angle from 45° to 60°.

A display device according to an embodiment comprises a substrate; a light emitting element disposed on the substrate; and an encapsulation layer disposed on the light emitting element. The encapsulation layer includes a lower inorganic encapsulation layer disposed on the light emitting element, an organic encapsulation layer disposed on the lower inorganic encapsulation layer, and an upper inorganic encapsulation layer disposed on the organic encapsulation layer. The lower inorganic encapsulation layer includes a first lower inorganic encapsulation layer with a third refractive index disposed on the light emitting element; a second lower inorganic encapsulation layer with a fourth refractive index disposed on the first lower inorganic encapsulation layer; a third lower inorganic encapsulation layer with a fifth refractive index disposed on the second lower inorganic encapsulation layer; and a fourth lower inorganic encapsulation layer with a sixth disposed on the third lower inorganic encapsulation layer. The third refractive index is greater than the fourth third refractive index, the fourth third refractive index is greater than the fifth third refractive index, and the sixth third refractive index is greater than the fifth third refractive index.

In a display device according to embodiments of the present disclosure, a change in visibility based on a user's viewing angle that is caused by a structure of a thin film encapsulation layer is reduced.

BRIEF DESCRIPTION OF THE DRAWINGS

FIG. 3 is a cross-sectional view of a portion of a display device according to an embodiment of the present disclosure.

DETAILED DESCRIPTION

Figure 1:
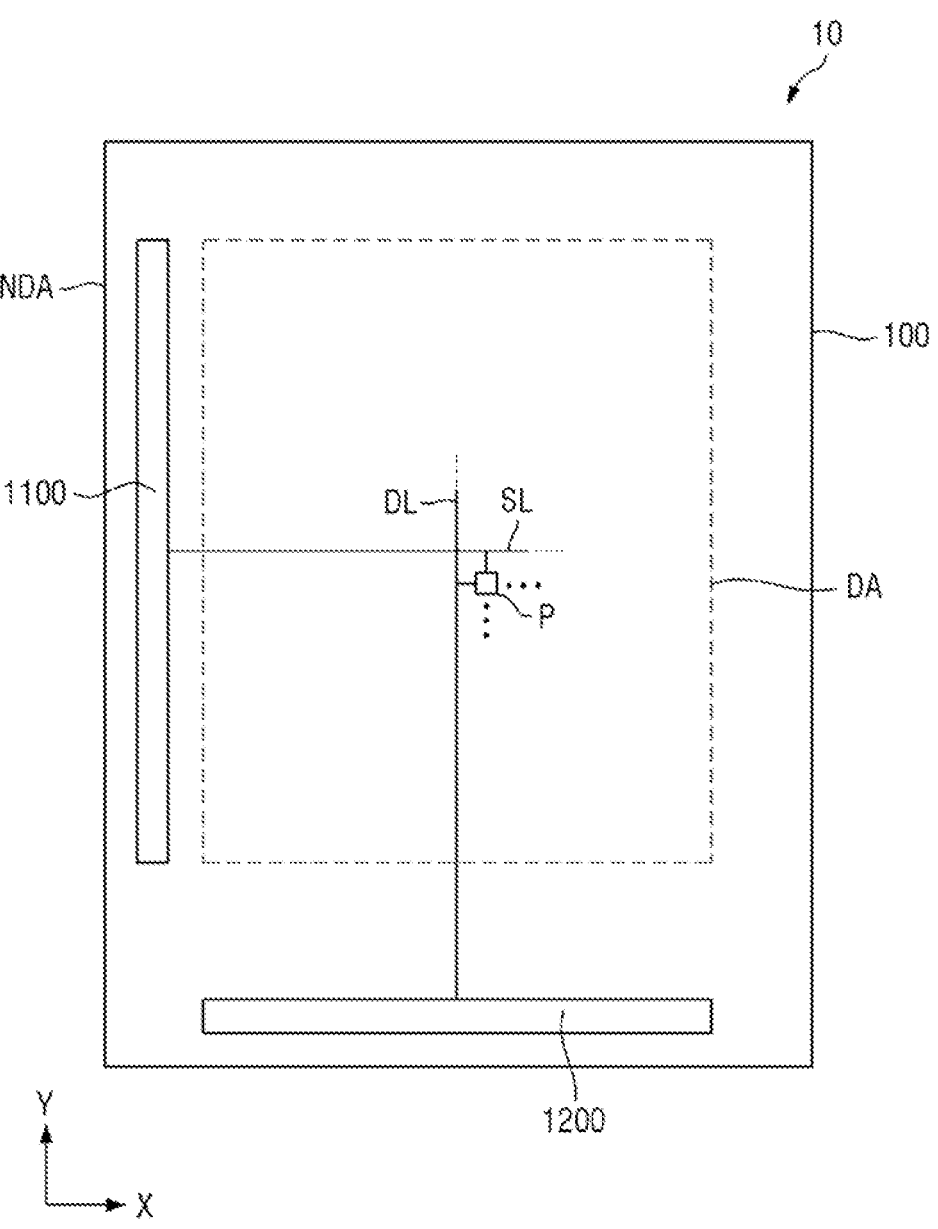
FIG. 1 is a schematic plan view of a display device according to an embodiment of the present disclosure.

Hereinafter, embodiments of the present disclosure will be described in detail with reference to the accompanying drawings. The same reference numerals may be given to same or corresponding elements in the description based on the drawings and a repeated description of the same or corresponding elements may be omitted.

In the following embodiment, when a film, area, or element is referred to as being "connected" or "coupled" to another element, it can be directly on, connected or coupled to another element, or it can be indirectly on, connected or coupled to another element such that intervening elements may be present.

In the following, the term "about" as used herein is inclusive of the stated value and means within an acceptable range of deviation for the particular value as determined by one of ordinary skill in the art, considering the measurement in question and the error associated with measurement of the particular quantity, such as limitations of the measurement system. For example, "about" may mean within one or more standard deviations as understood by one of the ordinary skill in the art. Further, it is to be understood that while parameters may be described herein as having "about" a certain value, according; to embodiments, the parameter may be exactly the certain value or approximately the certain value within a measurement error as would be understood by a person having ordinary skill in the art.

In the following embodiment, x-axis, y-axis and z-axis are not limited to three axes on an orthogonal coordinate system and may be interpreted in a broad sense including the same FIG. 1 is a schematic plan view of a display device according to one embodiment of the present disclosure.

Referring to FIG. 1, in an embodiment, the display device 10 includes a substrate 100, and the substrate 100 includes a display area DA and a non-display area NDA adjacent to the display area DA. The display device 10 includes a plurality of pixel areas P disposed in the display area DA. A display element capable of emitting light of a predetermined color is disposed in each pixel area P, and the display element is connected to a scan line SL and a data line DL.

A scan driver 1100 that transmits a scan signal to each pixel area P through the scan line SL, a data driver 1200 that transmits a data signal to the display element in each pixel area P through the data line DL, and a main power line that provides first and second power voltages are disposed on the non-display area NDA.

Although FIG. 1 shows that the data driver 1200 is disposed on the substrate 100, the data driver 1200 may be disposed on a flexible printed circuit board (FPCB) electrically connected to the substrate 100 by a pad disposed on one side of the display device.

The display device 10 according to an embodiment of the present disclosure may include an organic light emitting display device, an inorganic light emitting display device, a quantum dot display device, etc. Hereinafter, an organic light emitting display device will be exemplarily described as a display device according to an embodiment of the present disclosure, however a display device according to embodiments of the present disclosure is not limited thereto, and features which will be described below may be incorporated into other types of display devices described as above.

Figure 2:
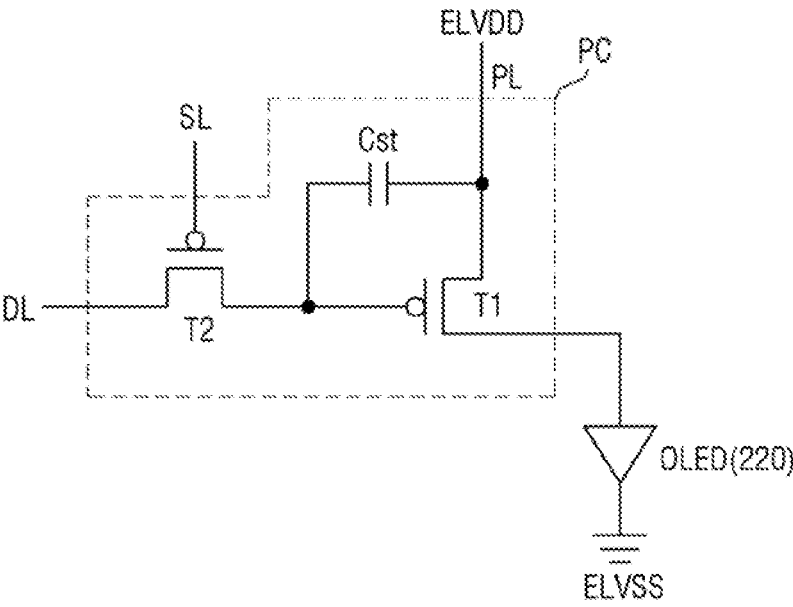
FIG. 2 illustrates a pixel circuit connected to a display element in a display device according to an embodiment of the present disclosure.

FIG. 2 illustrates a pixel circuit PC connected to a display element in a display device according to an embodiment of the present disclosure.

Referring to FIG. 2, in an embodiment, the display element includes a light emitting element. The light emitting element includes an organic light emitting diode (OLED) 220. The organic light emitting diode 220 is connected to the pixel circuit PC. The pixel circuit PC includes a first thin film transistor T1, a second thin film transistor T2 and a storage capacitor Cst. The organic light emitting diode 220 may emit red, green or blue light, or may emit red, green, blue or white light.

The second thin film transistor T2 is a switching thin film transistor and is connected to the scan line SL and the data line DL, and transmits a data voltage received from the data line DL to the first thin film transistor T1 in accordance with a switching voltage received from the scan line SL. The storage capacitor Cst is connected to the second thin film transistor T2 and a driving voltage line PL, and stores a voltage that corresponds to a difference between a voltage received from the second thin film transistor T2 and a first power voltage ELVDD received from the driving voltage line PL.

The first thin film transistor T1 is a driving thin film transistor, and is connected to the driving voltage line PL and the storage capacitor Cst, and controls a driving current that flows from the driving voltage line PL to the organic light emitting diode 220 in response to the voltage value stored in the storage capacitor Cst. The organic light emitting diode 220 emits light that has a luminance determined by the driving current. A counter electrode, such as a cathode, of the organic light emitting diode 220 is supplied with a second power voltage ELVSS.

Although FIG. 2 illustrates that the pixel circuit PC includes two thin film transistors and one storage capacitor, embodiments are not limited thereto, and in other embodiment, various modifications may be made in the number of thin film transistors or the number of storage capacitors depending on the design of the pixel circuit PC.

Figure 3:
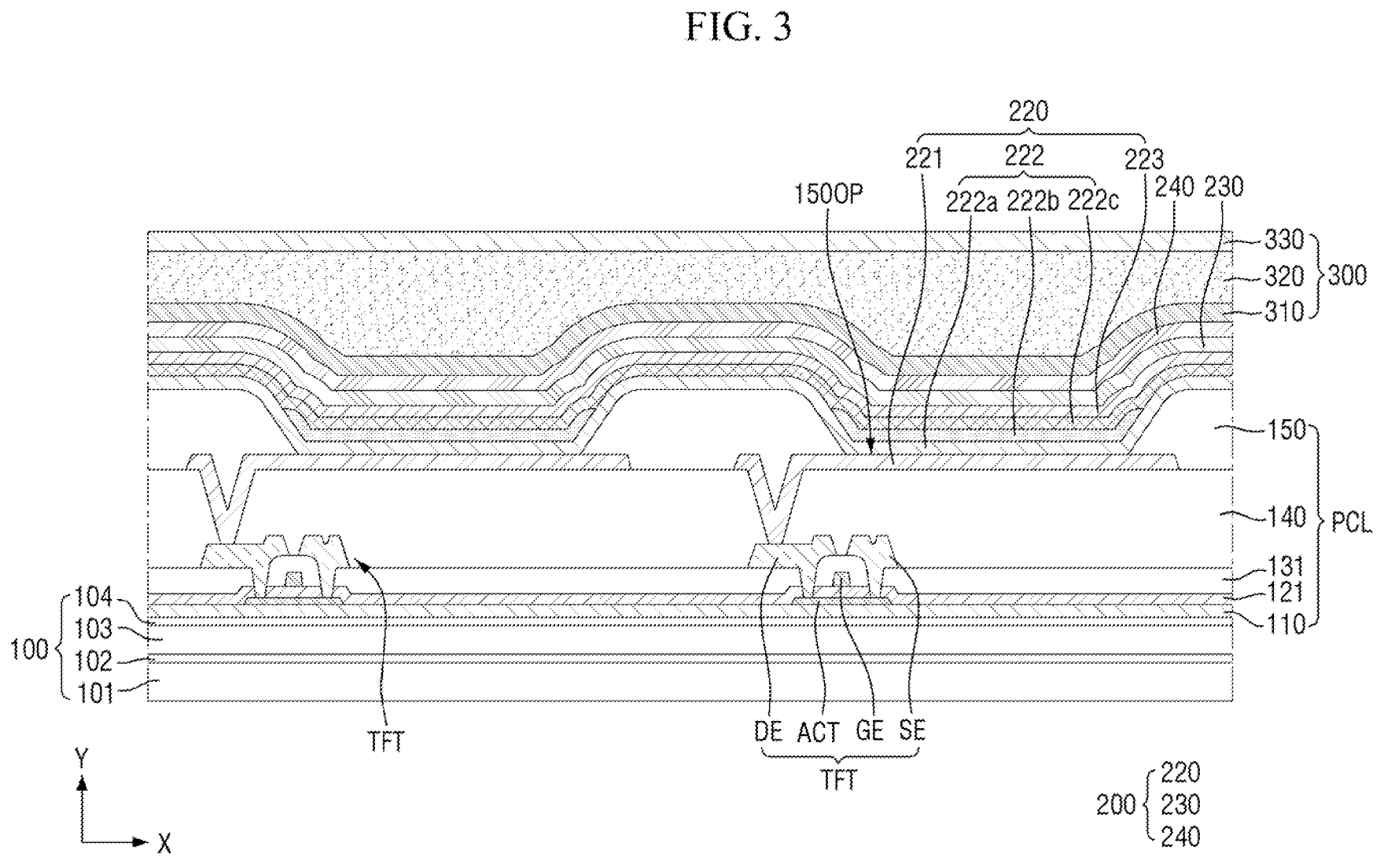

FIG. 3 is a cross-sectional view of a portion of a display device according to an embodiment.

Referring to FIG. 3, in an embodiment, a pixel circuit layer PCL that includes a pixel circuit, is disposed on a substrate 100, and a display element layer 200 is disposed on the pixel circuit layer PCL. The organic light emitting diode 220, which is a display element, is disposed on the pixel circuit layer PCL and is covered with an encapsulation layer 300. The display element layer 200 may include the organic light emitting diode 220, a first layer 230, and a second layer 240. The organic light emitting diode 220 includes a first electrode 221, an intermediate layer 222 and a second electrode 223. The first layer 230 is disposed between the organic light emitting diode 220 and the encapsulation layer 300, and the second layer 240 may be disposed between the first layer 230 and the encapsulation layer 300. Since the first layer 230 caps the second electrode 223 of the organic light emitting diode 220 by covering the second electrode 223 as described below, the first layer 230 may be referred to as a capping layer 230.

The substrate 100 includes a polymer resin. The substrate 100 that includes the polymer resin is flexible, rollable or bendable.

In an embodiment, the substrate 100 include a first base layer 101, a first barrier layer 102, a second base layer 103 and a second barrier layer 104, as shown in FIG. 3. Each of the first base layer 101 and the second base layer 103 includes a polymer resin. For example, the first base layer 101 and the second base layer 103 include a polymer resin such as polyethersulfone (PES), polyarylate (PAR), polyetherimide (PEI), polyethyelenene napthalate (PEN), polyethyeleneterepthalate (PET), polyphenylene sulfide (PPS), polyimide (PI), Poly Carbonate, cellulose tree acetate (TAC), or cellulose acetate propionate (CAP). The first barrier layer 102 and the second barrier layer 104 prevent external particles from permeating thereinto, and may be a single layer or a multi-layer structure that includes an inorganic material such as silicon nitride or silicon oxide.

In some embodiments, the substrate 100 is a single layer that includes a glass. For example, the substrate 100 is a glass substrate that contains $SiO_2$ as a main component.

The pixel circuit layer PCL on the substrate 100 includes a thin film transistor TFT, and may include a storage capacitor connected to the thin film transistor TFT. The thin film transistor TFT has the same structure for each pixel. Each thin film transistor TFT is connected to the display element in each pixel.

The thin film transistor TFT includes a semiconductor layer ACT that includes an amorphous silicon, a polycrystalline silicon or an organic semiconductor material, a gate electrode GE, a source electrode SE and a drain electrode DE. To provide insulation between the semiconductor layer ACT and the gate electrode GE, a gate insulating layer 121 that includes an inorganic material such as silicon oxide, silicon nitride and/or silicon oxynitride, is interposed between the semiconductor layer ACT and the gate electrode GE. An inter-layer dielectric layer 131 that includes an inorganic material such as silicon oxide, silicon nitride and/or silicon oxynitride, is disposed above the gate electrode GE, and the source electrode SE and the drain electrode DE are disposed on the inter-layer dielectric layer 131. The inter-layer dielectric layer may be formed by chemical vapor deposition (CVD) or atomic layer deposition (ALD).

The gate electrode GE, the source electrode SE and the drain electrode DE are formed of various conductive materials. The gate electrode GE may include molybdenum (Mo) or aluminum (Al), and may have a single layered structure or a multi-layered structure. For example, the gate electrode GE may be a single layer of molybdenum (Mo), or a three-layered structure that includes a molybdenum layer, an aluminum layer and a molybdenum layer. The source electrode SE and the drain electrode DE may include titanium (Ti) or aluminum (Al), and may have a single layered structure or a multi-layered structure. In an embodiment, the source electrode SE and the drain electrode DE have a three-layered structure that includes a titanium layer, an aluminum layer and a titanium layer.

A buffer layer 110 that includes an inorganic material such as silicon oxide, silicon nitride and/or silicon oxynitride, is interposed between the thin film transistor TFT and the substrate 100. The buffer layer 110 enhances planarization on an upper surface of the substrate 100, and can prevent or minimize permeation of particles from the substrate 100 into the semiconductor layer ACT of the thin film transistor TFT.

A planarization insulating layer 140 is disposed on the thin film transistor TFT. The planarization insulating layer 140 is formed of an organic material such as acryl, benzocyclobutene (BCB) or hexamethyldisilazane (HMDSO). Although the planarization insulating layer 140 is shown as a single layer in FIG. 3, embodiments are not limited thereto, and in other embodiments, the planarization insulating layer 140 has a multi-layer structure.

As disclosed above, the organic light emitting diode 220 includes a first electrode 221, an intermediate layer 222 and a second electrode 223. The first electrode 221 is a pixel electrode or a cathode electrode. The second electrode 223 is a cathode electrode when the first electrode 221 is a pixel electrode, and is a pixel electrode when the first electrode 221 is a cathode electrode. Hereinafter, an embodiment will be described in which the first electrode 221 is the pixel electrode 221 and the second electrode 223 is the cathode electrode or the counter electrode 223.

The pixel electrode 221 is disposed on the planarization insulating layer 140, and is disposed one by one for each pixel. The pixel electrode 221 is a reflective electrode. In an embodiment, the pixel electrode 221 includes a reflective layer that includes at least one of silver (Ag), magnesium (Mg), aluminum (Al), platinum (Pt), palladium (Pd), gold (Au), nickel (Ni), neodymium (Nd), iridium (Ir), or chromium (Cr), or their compounds. In an embodiment, the pixel electrode 221 includes a transparent or translucent electrode layer disposed above and/or below the reflective layer described above. The transparent or translucent electrode layer includes at least one of indium tin oxide (ITO), indium zinc oxide (IZO), zinc oxide (ZnO), indium oxide ($In_2O_3$), indium gallium oxide (IGO), or aluminum zinc oxide (AZO). In some embodiments, the pixel electrode 221 has a three-layered structure of an ITO layer, an Ag layer and an ITO layer.

A pixel defining layer 150 is disposed on the pixel electrodes 221. The pixel defining layer 150 has an opening 150OP that exposes a central portion of each pixel electrode 221. The pixel defining layer 150 prevents an arc from occurring at an edge of the pixel electrode 221 by increasing a distance between the edge of the pixel electrode 221 and the counter electrode 223. The pixel defining layer 150 is formed of an organic insulating material such as polyimide, polyamide, acrylic resin, benzocyclobutene, hexamethyldisiloxane (HMDSO) or phenol resin by a spin coating method, etc.

A light emitting layer 222b is disposed on the portion of the pixel electrode 221 exposed through the opening 150OP of the pixel defining layer 150. The light emitting layer 222b is an organic material that includes a fluorescent or phosphorescent material that can emit red, green or red light. The aforementioned organic material may be a low molecular organic material or a polymer organic material.

A first functional layer 222a and a second functional layer 222c are respectively disposed below and above the light emitting layer 222b. The first functional layer 222a includes, for example, a hole transport layer (HTL), or may include a hole transport layer and a hole injection layer (HIL). The second functional layer 222c is disposed above the light emitting layer 222b, and includes an electron transport layer (ETL) and/or an electron injection layer (EIL). The second functional layer 222c is optional. In some embodiments, the second functional layer 222c is omitted.

The light emitting layer 222b is disposed to correspond to the opening of the pixel defining layer 150, whereas the first functional layer 222a and the second functional layer 222c are common layers integrally formed to cover the substrate 100, for example, to fully cover the display area of the substrate 100 in the same manner as the counter electrode 223 that will be described below. However, embodiments are not limited thereto, and in some embodiments, the light emitting layer 222*b* is also integrally formed to fully cover the substrate 100, for example, to fully cover the display area of the substrate 100 in the same manner as the first functional layer 222*a* and the second functional layer 222*c*.

The counter electrode 223 includes a (semi-)transparent layer that includes at least one of silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca), or their alloy. Alternatively, in other embodiments, the counter electrode 223 further includes a layer such as ITO, IZO, ZnO, or $In_2O_3$ on the (semi-)transparent layer. In an embodiment, the counter electrode 223 includes one of silver (Ag), magnesium (Mg), or an alloy of silver (Ag) and magnesium (Mg).

The capping layer 230 is disposed on the counter electrode 223. The capping layer 230 protects the counter electrode 223 by covering the counter electrode 223. The capping layer 230 may include an inorganic insulating material or an organic insulating material. Examples of the inorganic insulating material include aluminum oxide, titanium oxide, tantalum oxide, hafnium oxide, zinc oxide, silicon oxide, silicon nitride, or silicon oxynitride. Although FIG. 3 illustrates that the capping layer 230 is formed as a single layer, embodiments are not limited thereto, and in other embodiments, the capping layer 230 is formed of a plurality of layers. A refractive index and thickness of the capping layer 230 will be described in conjunction with those of the encapsulation layer 300.

The second layer 240 is disposed on the capping layer 230. The second layer 240 may include an inorganic insulating material or an organic insulating material. In an embodiment, the second layer 240 includes, but is not limited to, fluorinated lithium (LiF).

The encapsulation layer 300 is disposed on the capping layer 230. The encapsulation layer 300 includes a lower inorganic encapsulation layer 310 disposed on the capping layer 230, an organic encapsulation layer 320 disposed on the lower inorganic encapsulation layer 310, and an upper inorganic encapsulation layer 330 disposed on the organic encapsulation layer 320.

The lower inorganic encapsulation layer 310 is disposed on the capping layer 230 and between the capping layer 230 and the organic encapsulation layer 320. The organic encapsulation layer 320 is disposed directly on the lower inorganic encapsulation layer 310 and between the lower inorganic encapsulation layer 310 and the upper inorganic encapsulation layer 330. The upper inorganic encapsulation layer 330 is disposed directly on the organic encapsulation layer 320.

The lower inorganic encapsulation layer 310 and the upper inorganic encapsulation layer 330 may include one or more inorganic insulating materials selected from aluminum oxide, titanium oxide, tantalum oxide, hafnium oxide, zinc oxide, silicon oxide, silicon nitride and silicon oxynitride. In some embodiments, the lower inorganic encapsulation layer 310 and the upper inorganic encapsulation layer 330 may include an inorganic insulating layer containing a nonmetallic element, for example, silicon oxide, silicon nitride, or silicon oxynitride.

The organic encapsulation layer 320 mitigates internal stress of the lower inorganic encapsulation layer 310 and/or the upper inorganic encapsulation layer 330. The organic encapsulation layer 320 includes a polymer-based material. The polymer-based material is at least one of polyethylene terephthalate, polyethylene naphthalate, polycarbonate, polyimide, polyethylene sulfonate, polyoxymethylene, polyarylate, hexamethyldisiloxane, an acrylic resin, such as polymethylmethacrylate or polyacrylic acid, etc., or combinations thereof.

The organic encapsulation layer 320 is formed by applying a flowable monomer and curing the monomer layer using heat or light, such as ultraviolet light. Alternatively, in other embodiments, the organic encapsulation layer 320 is formed by applying the aforementioned polymer based material.

As described below with respect to FIG. 4, a thickness 19 of the organic encapsulation layer 320 is thicker than that of each of layers 311, 313, 315 and 319 of the lower inorganic encapsulation layer 310, which will be described below. For example, the thickness T9 of the organic encapsulation layer 320 ranges from about 800,000 nm to about 1,500,000 nm, and has a thickness greater than an optical control thickness range that control visibility changes that occur on a color coordinate as a user's viewing angle increases. The organic encapsulation layer 320 has a refractive index of 1.4 to 1.6. A thickness T10 of the upper inorganic encapsulation layer 330 is less than the thickness T9 of the organic encapsulation layer 320. The thickness T10 of the upper inorganic encapsulation layer 330 ranges from about 40,000 nm to about 800,000 nm. A refractive index of the upper inorganic encapsulation layer 330 is greater than that of the organic encapsulation layer 320. The refractive index of the upper inorganic encapsulation layer 330 ranges from 1.8 to 2.0.

The lower inorganic encapsulation layer 310 according to an embodiment of the present disclosure includes a plurality of films. The plurality of films of the lower inorganic encapsulation layer 310 are deposited. By adjusting the refractive indices and thicknesses of the plurality of deposited films of the lower inorganic encapsulation layer 310, the capping layer 230 below the lower inorganic encapsulation layer 310, and the second layer 240, the occurrence of visibility changes based on the user's viewing angle can be minimized. This will be described in detail with reference to FIG. 4.

Figure 4:
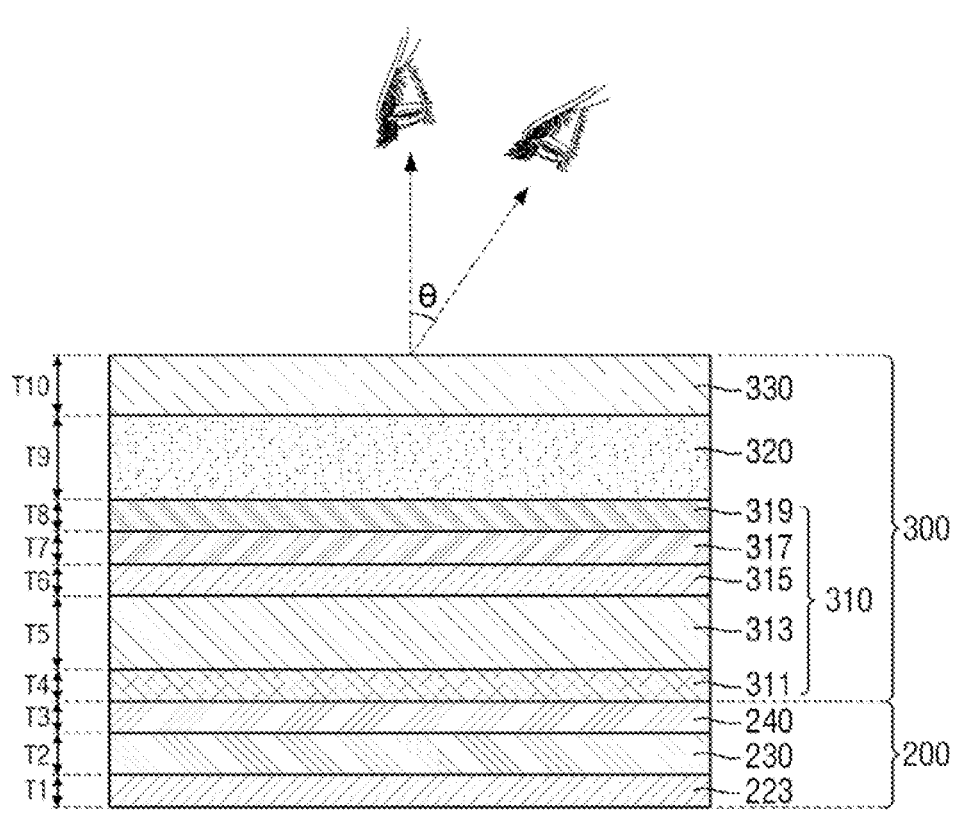
FIG. 4 is a schematic view of a display device according to an embodiment of the present disclosure.

FIG. 4 is a schematic view of a display device according to an embodiment of the present disclosure.

A description of elements in FIG. 4 that are described with respect to FIG. 3, will be omitted. Referring to FIG. 4, a display device according to an embodiment of the present disclosure reduce a visibility change based on a user's viewing angle by adjusting the refractive indices of adjacent films of the plurality of films of the lower inorganic encapsulation layer 310 with respect to those of the capping layer 230 and the second layer 240. In an embodiment, the lower inorganic encapsulation layer 310 includes, sequentially, a first lower inorganic encapsulation layer 311 disposed directly on the second layer 240, a second lower inorganic encapsulation layer 313 disposed directly on the first lower inorganic encapsulation layer 311, a third lower inorganic encapsulation layer 315 disposed directly on the second lower inorganic encapsulation layer 313, a fourth lower inorganic encapsulation layer 317 disposed directly on the third lower inorganic encapsulation layer 315, and a third layer 319 disposed directly on the fourth lower inorganic encapsulation layer 317. The third layer 319 includes silicon oxide or silicon oxynitride. The inorganic insulating material of the third layer 319 has an oxygen (O) content that is greater than a nitrogen (N) content.

The refractive index difference and thickness (T1, T2, T3, T4, T5, T6, T7, T8) adjustments between adjacent layers control differs from the known technology. Accordingly, a detailed description of the refractive index difference and thickness (T1, T2, T3, T4, T5, T6, T7, T8) adjustments between adjacent layers will be described below. When the difference in the refractive index between adjacent layers or films is small, visibility might not change to a specific color, depending on the user's viewing angle $\theta$. In this case, as shown in FIG. 4, the viewing angle $\theta$ is defined as an angle between a gaze direction of the user and a normal vector of an upper surface of the upper inorganic encapsulation layer 330. When the display device is viewed in a vertical direction, the viewing angle $\theta$ becomes 0°.

According to an embodiment of the present disclosure, as described below, differences in the refractive indices between the adjacent layers or films of the capping layer 230, the second layer 240, the first lower inorganic encapsulation layer 311, the second lower inorganic encapsulation layer 313, the third lower inorganic encapsulation layer 315, the fourth lower inorganic encapsulation layer 317 and the third layer 319 can be finely adjusted to prevent visibility changing to blue as the user's viewing angle increases. Moreover, thicknesses T1, T2, T3, T4, T5, T6, T7 and T8 of the respective layers or films are factors that optically have an influence on the change in visibility, by, e.g., forming resonance, and thus should also be finely adjusted.

In an embodiment, the second electrode 223 has a first thickness T1, the capping layer 230 has a second thickness T2, the second layer 240 has a third thickness T3, the first lower inorganic encapsulation layer 311 has a fourth thickness T3, the second lower inorganic encapsulation layer 313 has a fifth thickness T5, the third lower inorganic encapsulation layer 315 has a sixth thickness T6 the fourth lower inorganic encapsulation layer 317 has a seventh thickness T7, and the third layer 319 has an eighth thickness T8.

In an embodiment, the capping layer 230 has a first refractive index, the second layer 240 has a second refractive index, the first lower inorganic encapsulation layer 311 has a third refractive index, the second lower inorganic encapsulation layer 311 has a fourth refractive index, the third lower inorganic encapsulation layer 315 has a fifth refractive index, the fourth lower inorganic encapsulation layer 317 has a sixth refractive index, and the third layer 319 has a seventh refractive index.

In an embodiment, the first refractive index is greater than the second refractive index, the third refractive index is greater than the second refractive index, the fourth refractive index is less than the third refractive index, the fifth refractive index is less than the fourth refractive index, and the sixth refractive index is less than the fifth refractive index.

In an embodiment, the first refractive index is from 1.7 to 2.2, the second refractive index is from 1.25 to 1.45, the third refractive index is from 1.8 to 2.0, the fourth refractive index is from 1.55 to 1.75, the fifth refractive index is from 1.4 to 1.65, the sixth refractive index is from 1.35 to 1.6, and the seventh refractive index is 1.5 or less.

In an embodiment, to prevent visibility from changing to blue as the user's viewing angle increases, differences in the refractive indices between adjacent layers or films of the capping layer 230, the second layer 240, the first lower inorganic encapsulation layer 311, the second lower inorganic encapsulation layer 313, the third lower inorganic encapsulation layer 315, the fourth lower inorganic encapsulation layer 317 and the third layer 319 are finely adjusted.

That is, differences in the refractive indices between the adjacent layers or films of the capping layer 230, the second layer 240, the first lower inorganic encapsulation layer 311, the second lower inorganic encapsulation layer 313, the third lower inorganic encapsulation layer 315, the fourth lower inorganic encapsulation layer 317 and the third layer 319 are adjusted to prevent a visibility change from occurring due to the increase of the user's viewing angle.

Moreover, to satisfy a thickness constraint of the capping layer 230, the second layer 240 and the inorganic encapsulation layers 311, 313, 315, 317 and 319, the fifth thickness T5 is greater than a sum of the second thickness T2, the third thickness T3 and the fourth thickness T4. In an embodiment, the first thickness T1 is 750 nm to 1150 nm, the second thickness T2 is 5000 nm to 15000 nm, the third thickness T3 is 2000 nm to 6000 nm, the fourth thickness T4 is 10000 nm to 20000 nm, the fifth thickness T5 is 70000 nm to 130000 nm, the sixth thickness T6 is 5000 nm to 15000 nm, the seventh thickness T7 is 5000 nm to 15000 nm and the eighth thickness T8 is 8000 nm or less.

The refractive indices of the first lower inorganic encapsulation layer 311, the second lower inorganic encapsulation layer 313, the third lower inorganic encapsulation layer 315 and the fourth lower inorganic encapsulation layer 317 vary depending on their materials and a composition ratio of the materials. The first lower inorganic encapsulation layer 311, the second lower inorganic encapsulation layer 313, the third lower inorganic encapsulation layer 315 and the fourth lower inorganic encapsulation layer 317 are formed through, but not limited to, a chemical vapor deposition CVD method. In more detail, in an embodiment, the first lower inorganic encapsulation layer 311, the second lower inorganic encapsulation layer 313, the third lower inorganic encapsulation layer 315 and the fourth lower inorganic encapsulation layer 317 are formed from silane ($SiO_4$), ammonium ($NH_4$) and oxygen ($O_2$), and a supply ratio of silane ($SiH_4$), ammonium ($NH_4$) and oxygen ($O_2$) is adjusted to change the composition ratio of the materials in the respective layers 311, 313, 315 and 317, and the refractive index of each of the layers 311, 313, 315 and 317 changes due to the changed composition ratio.

Typically, the greater the supply ratio of ammonium ($NH_4$) is and the lesser the supply ratio of oxygen ($O_2$) is, the greater is the refractive index of silicon oxynitride formed from silane ($SiH_4$), ammonium ($NH_4$) and oxygen ($O_2$) through a chemical vapor deposition method. In other words, the greater nitrogen (N) content in the silicon oxynitride material of each of the layers 311, 313, 315 and 317 is and the lesser the oxygen (O) content therein is, the greater is the refractive index of the silicon oxynitride.

Therefore, in an embodiment, to have a gradient from a high refraction to a low refraction in the order of the first lower inorganic encapsulation layer 311, the second lower inorganic encapsulation layer 313, the third lower inorganic encapsulation layer 315 and the fourth lower inorganic encapsulation layer 317, in a deposition direction from the first lower inorganic encapsulation layer 311 to the fourth lower inorganic encapsulation layer 317, the oxygen (O) content in the silicon oxynitride material gradually increases whereas the nitrogen (N) content in the silicon oxynitride material gradually decreases.

Hereinafter, a description is provided of a decrease of a visibility change based on a viewing angle on a color coordinate (CIE) according to the deposited structure of the capping layer 230, the second layer 240, the first lower inorganic encapsulation layer 311, the second lower inorganic encapsulation layer 313, the third lower inorganic encapsulation layer 315 and the fourth lower inorganic encapsulation layer 317 according to one embodiment.

Figure 5:
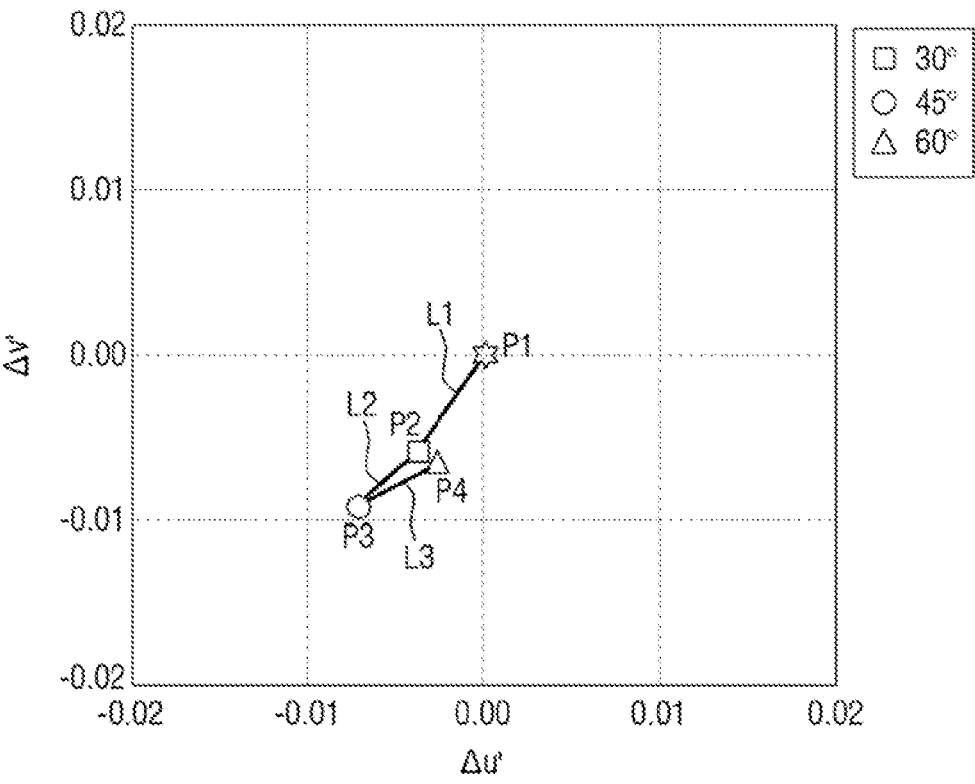
FIG. 5 is a graph of a variance Δu' of a first component and a variance Δv' of a second component as a function of a viewing angle on a color coordinate.

FIG. 5 is a graph of a variance $\Delta u'$ of a first component of light emitted from the light emitting element through the first layer, the second layer and the encapsulation layer, and a variance $\Delta v'$ of a second component of light emitted from the light emitting element through the first layer, the second layer and the encapsulation layer as a function of a viewing angle on a color coordinate.

The graph of FIG. 5 is a color coordinate (CIE diagram) of a visible ray area widely known in the art, wherein a horizontal axis indicates a variation $\Delta u'$ of the first component, a vertical axis indicates a variation $\Delta v'$ of the second component, and the variation $\Delta u'$ of the first component and the variation $\Delta v'$ of the second component in a square one are 0, respectively. A color coordinate at a viewing angle of 0°, which is defined in FIG. 4, is a first point P1 of FIG. 5, a color coordinate at a viewing angle of 30° is a second point P2 of FIG. 5, a color coordinate at a viewing angle of 45° is a third point P3 of FIG. 5, and a color coordinate at a viewing angle of 60° is a fourth point P4 of FIG. 5.

At the first point, each of the variance $\Delta u'$ of the first component and the variance $\Delta v'$ of the second component is 0. At the second point P2, the variance $\Delta u'$ of the first component is about 0.005 and the variance $\Delta v'$ of the second component is about –0.005. At the third point P3, the variance $\Delta u'$ of the first component is about –0.008 and the variance $\Delta v'$ of the second component is about –0.009. At the fourth point P4, the variance $\Delta u'$ of the first component is about –0.003 and the variance $\Delta v'$ of the second component is about –0.006.

In FIG. 5, a first line L1 that connects the first point P1 with the second point P2, a second line L2 that connects the second point P2 with the third point P3, and a third line L3 that connects the third point P3 with the fourth point P4 are further defined.

According to an embodiment, the first line L1, the second line L2 and the third line L3 are linear. That is, the first line L1, the second line L2 and the third line L3 have a generally linear shape.

At viewing angles of 30°, 45° and 60°, each of the variation $\Delta u'$ of the first component and the variation $\Delta v'$ of the second component has a negative value. In this case, when the color coordinates are sequentially measured at a viewing angle from 0° to 30° and a viewing angle from 30° to 45°, the variation $\Delta u'$ of the first component and the variation $\Delta v'$ of the second component decreases. When the color coordinates are measured at a viewing angle from 45° to 60°, the variation $\Delta u'$ of the first component and the variation $\Delta v'$ of the second component increases.

When color coordinates (CIE) are interpreted, white is displayed when the variation $\Delta u'$ of the first component and the variation $\Delta v'$ of the second component are close to the first point P1. In particular, when the viewing angle is greater than 0°, a blue component of visible light occupies a large portion of a color coordinate on a third quadrant where the variation $\Delta u'$ of the first component and the variation $\Delta v'$ of the second component each has a negative value, and as the second point P2 to the fourth point P4 are far from the first point P1.

However, according to an embodiment, when the color coordinates are sequentially measured at a viewing angle from 0° to 30° and a viewing angle from 30° to 45°, the variation $\Delta u'$ of the first component and the variation $\Delta v'$ of the second component decreases. On the other hand, when the color coordinates are measured at a viewing angle from 45° to 60°, the variation $\Delta u'$ of the first component and the variation $\Delta v'$ of the second component increases. Therefore, visibility is prevented from changing to blue as the viewing angle increases from 45°.

Hereinafter, other embodiments of a display device will be described.

Figure 6:
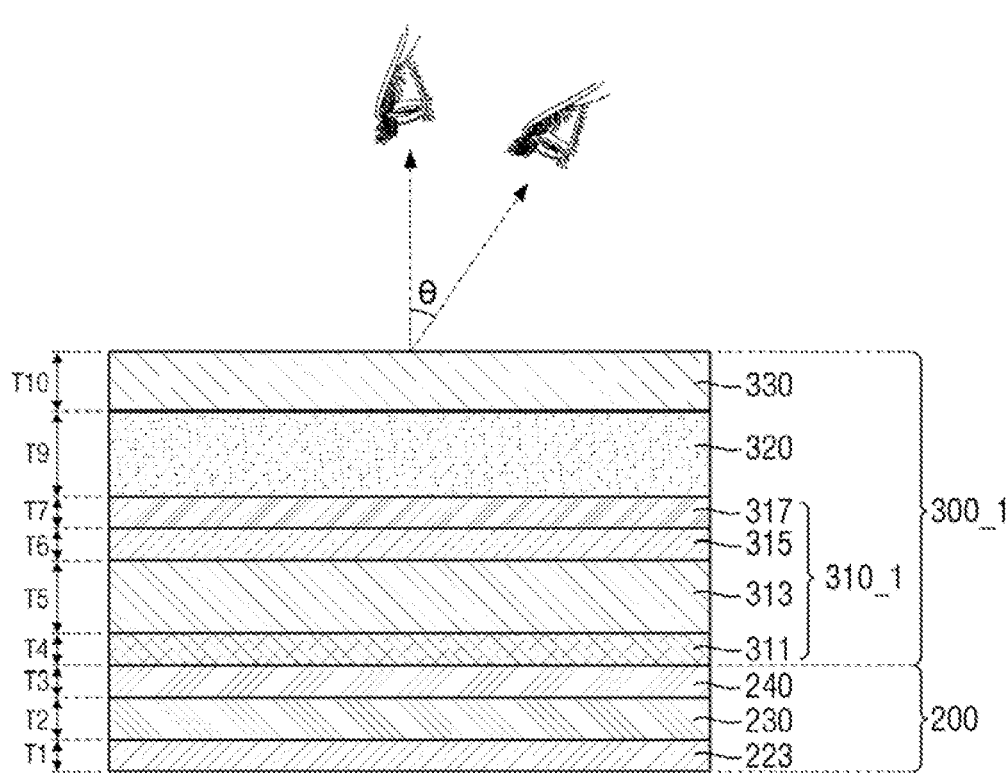
FIG. 6 is a schematic view of a display device according to an embodiment of the present disclosure.

FIG. 6 is a schematic view of a display device according to an embodiment of the present disclosure.

Referring to FIG. 6, a display device according to an embodiment differs from a display device of FIG. 4 in that a third layer 319 of a lower inorganic encapsulation layer 310_1 of an encapsulation layer 300_1 is omitted. Therefore, a fourth lower inorganic encapsulation layer 317 is in direct contact with an organic encapsulation layer 320.

The other detailed description has been made with reference to FIG. 4 and thus will be omitted hereinafter.

Figure 7:
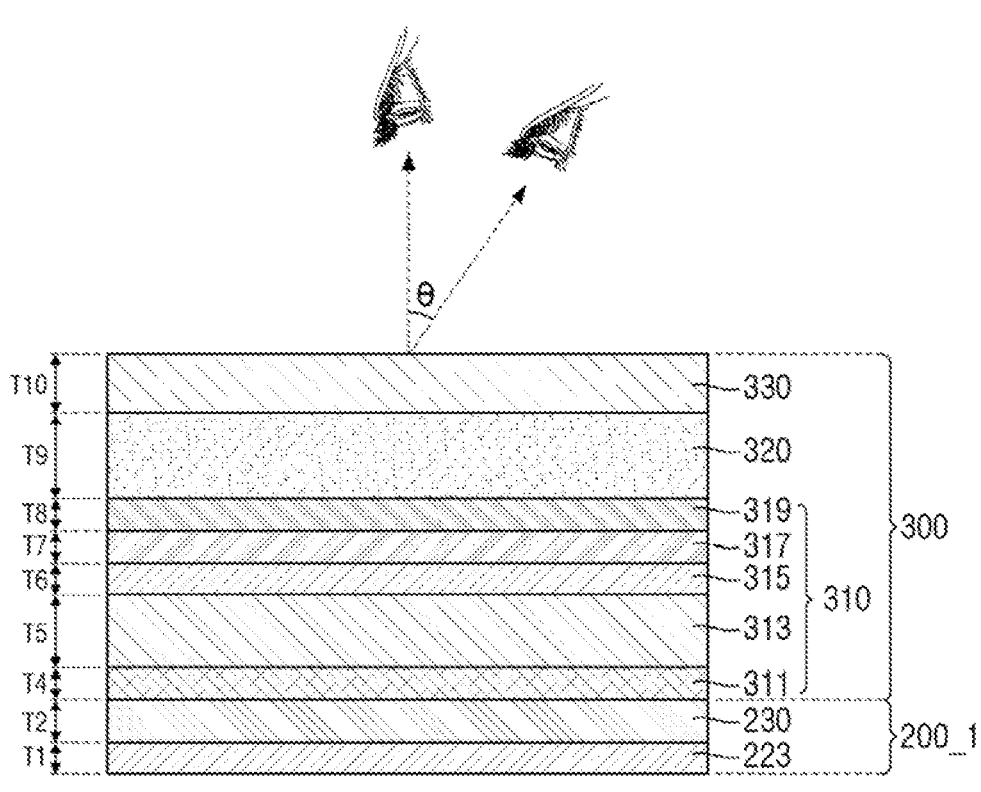
FIG. 7 is a schematic view of a display device according to an embodiment of the present disclosure.

FIG. 17 is a schematic view of a display device according an embodiment of the present disclosure;

Referring to FIG. 7, a display device according to an embodiment differs from a display device of FIG. 4 in that a display element layer 200_1 does not include a second layer 240.

Therefore, a first lower inorganic encapsulation layer 311 is disposed directly on a capping layer 230.

The other detailed description has been made with reference to FIG. 4 and thus will be omitted hereinafter.

Figure 8:
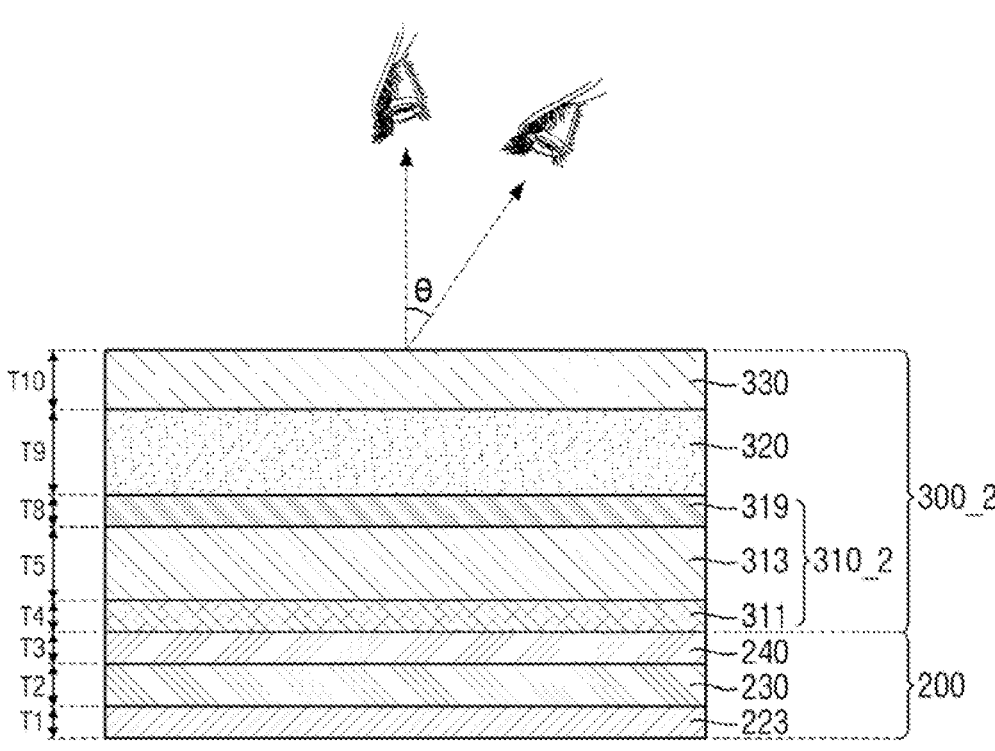
FIG. 8 is a schematic view of a display device according to an embodiment of the present disclosure.

FIG. 8 is a schematic view of a display device according to an embodiment of the present disclosure.

Referring to FIG. 8, a display device of an embodiment differs from a display device of FIG. 4 in that a third lower inorganic encapsulation layer 315 and a fourth lower inorganic encapsulation layer 317 of a lower inorganic encapsulation layer 310_2 of an encapsulation layer 300_2 are omitted.

Therefore, a third layer 319 is disposed directly on a second lower inorganic encapsulation layer 313.

The other detailed description has been made with reference to FIG. 4 and thus will be omitted hereinafter.

Figure 9:
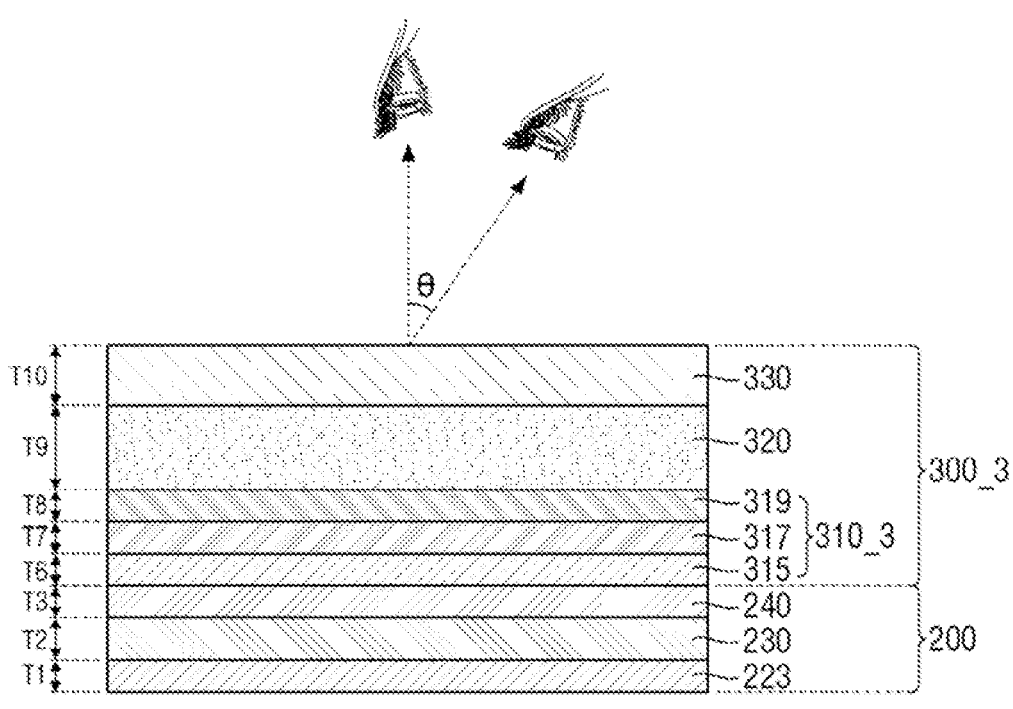
FIG. 9 is a schematic view of a display device according to an embodiment of the present disclosure.

FIG. 9 is a schematic view of a display device according to an embodiment of the present disclosure.

Referring to FIG. 9, a display device of an embodiment differs from a display device of FIG. 4 in that a first lower inorganic encapsulation layer 311 and a second lower inorganic encapsulation layer 313 of a lower inorganic encapsulation layer 310_3 of an encapsulation layer 300_3 are omitted.

Therefore, a third lower inorganic encapsulation layer 315 is disposed directly on a second layer 240.

The other detailed description has been made with reference to FIG. 4 and thus will be omitted hereinafter.

Although the embodiments of the present disclosure have been described with reference to the accompanying drawings, this is only illustrative, and it will be apparent to those skilled in the art that various modifications may be made in embodiments of the present disclosure. Thus, the technical scope of embodiments of the present disclosure should be determined by technical spirits of the accompanying claims.

What is claimed is:

1. A display device, comprising:
   a substrate;
   a light emitting element disposed on the substrate;
   a first layer disposed directly on the light emitting element,
   a second layer disposed on the first layer; and
   an encapsulation layer disposed on the second layer,
   wherein the first layer has a first refractive index greater than or equal to about 1.7 and less than 2.2 and a thickness from about 5000 nm to about 15000 nm, and
   wherein the second layer has a second refractive index from about 1.25 to about 1.45 and a thickness from about 2000 nm to about 6000 nm.

2. The display device of claim 1, wherein the encapsulation layer includes:

a lower inorganic encapsulation layer disposed on the second layer;

an organic encapsulation layer disposed on the lower inorganic encapsulation layer; and an upper inorganic encapsulation layer disposed on the organic encapsulation layer, wherein the lower inorganic encapsulation layer includes a first lower inorganic encapsulation layer disposed on the second layer;

a second lower inorganic encapsulation layer disposed on the first lower inorganic encapsulation layer;

a third lower inorganic encapsulation layer disposed on the second lower inorganic encapsulation layer; and a fourth lower inorganic encapsulation layer disposed on the third lower inorganic encapsulation layer, the first lower inorganic encapsulation layer has a third refractive index, the second lower inorganic encapsulation layer has a fourth refractive index, the third lower inorganic encapsulation layer has a fifth refractive index, and the fourth lower inorganic encapsulation layer has a sixth refractive index.

3. The display device of claim 2, wherein the third refractive index is greater than the second refractive index, and the third refractive index is from about 1.8 to about 2.0.

4. The display device of claim 3, wherein the fourth refractive index is less than the third refractive index.

5. The display device of claim 4, wherein the fourth refractive index is from about 1.55 to about 1.75.

6. The display device of claim 4, wherein the fifth refractive index is from about 1.4 to about 1.65.

7. The display device of claim 6, wherein the fifth refractive index is less than the fourth refractive index.

8. The display device of claim 7, wherein the sixth refractive index is from about 1.35 to about 1.6.

9. The display device of claim 8, wherein the sixth refractive index is less than the fifth refractive index.

10. The display device of claim 2, wherein the first layer includes an inorganic insulating material, and the second layer includes fluorinated lithium (LiF).

11. The display device of claim 2, further comprising a third layer disposed between the fourth lower inorganic encapsulation layer and the organic encapsulation layer, wherein an oxygen content of the third layer is greater than a nitrogen content of the third layer, wherein the third layer has a seventh refractive index that is less than or equal to about 1.5.

12. The display device of claim 2, wherein the light emitting element includes a first electrode disposed on the substrate, an organic layer disposed on the first electrode and a second electrode disposed on the organic layer, the second electrode has a first thickness, and the first thickness is from about 750 nm to about 1150 nm.

13. The display device of claim 12, wherein the thickness of first layer is a second thickness, the thickness of second layer is a third thickness, the first lower inorganic encapsulation layer has a fourth thickness, the second lower inorganic encapsulation layer has a fifth thickness, the third lower inorganic encapsulation layer has a sixth thickness, the fourth lower inorganic encapsulation layer has a seventh thickness, the third layer has an eighth thickness, the fourth thickness is from about 10000 nm to about 20000 nm, the fifth thickness is from about 70000 nm to about 130000 nm, the sixth thickness is from about 5000 nm to about 15000 nm, the seventh thickness is from about 5000 nm to about 15000 nm, and the eighth thickness is about 8000 nm or less.

14. A display device, comprising:

a substrate;

a light emitting element disposed on the substrate;

a first layer disposed directly on the light emitting element, and a second layer disposed on the first layer, wherein the light emitting element includes a first electrode disposed on the substrate, an organic layer disposed on the first electrode, and a second electrode disposed on the organic layer, wherein the first layer has a first refractive index greater than or equal to about 1.7 and less than 2.2 and a thickness from about 5000 nm to about 15000 nm, wherein the second layer has a second refractive index from about 1.25 to about 1.45 and a thickness from about 2000 nm to about 6000 nm, wherein the second electrode has a first thickness, wherein the thickness of the first layer is a second thickness, wherein the thickness of the second layer is a third thickness, and wherein the first thickness is from about 750 nm to about 1150 nm.

15. The display device of claim 14, further comprising an encapsulation layer disposed on the second layer, wherein the encapsulation layer includes:

a lower inorganic encapsulation layer disposed on the second layer;

an organic encapsulation layer disposed on the lower inorganic encapsulation layer; and an upper inorganic encapsulation layer disposed on the organic encapsulation layer, wherein the lower inorganic encapsulation layer includes:

a first lower inorganic encapsulation layer disposed on the second layer;

a second lower inorganic encapsulation layer disposed on the first lower inorganic encapsulation layer;

a third lower inorganic encapsulation layer disposed on the second lower inorganic encapsulation layer;

a fourth lower inorganic encapsulation layer disposed on the third lower inorganic encapsulation layer; and a third layer disposed on the fourth lower inorganic encapsulation layer, wherein the first lower inorganic encapsulation layer has a third refractive index, the second lower inorganic encapsulation layer has a fourth refractive index, the third lower inorganic encapsulation layer has a fifth refractive index, the fourth lower inorganic encapsulation layer has a sixth refractive index, and the third layer has a seventh refractive index.

16. The display device of claim 15, wherein
the third refractive index is greater than the second refractive index,
the third refractive index is from about 1.8 to about 2.0,
the fourth refractive index is less than the third refractive index,
the fourth refractive index is from about 1.55 to about 1.75,
the fifth refractive index is from about 1.4 to about 1.65,
the fifth refractive index is less than the fourth refractive index,
the sixth refractive index is from about 1.35 to about 1.6, and
the sixth refractive index is less than the fifth refractive index.

17. The display device of claim 15, wherein
the first lower inorganic encapsulation layer has a fourth thickness,
the second lower inorganic encapsulation layer has a fifth thickness, and
the fifth thickness is greater than a sum of the second thickness, the third thickness and the fourth thickness.

18. A display device, comprising:
a substrate;
a light emitting element disposed on the substrate;
a first layer disposed on the light emitting element,
a second layer disposed on the first layer; and
an encapsulation layer disposed on the second layer,
wherein the encapsulation layer includes a lower inorganic encapsulation layer disposed on the second layer, an organic encapsulation layer disposed on the lower inorganic encapsulation layer, and an upper inorganic encapsulation layer disposed on the organic encapsulation layer,
on color coordinates of a CIE diagram where a variation $\Delta u'$ of a first component of light emitted from the light emitting element through the first layer, the second layer and the encapsulation layer is a horizontal axis, a variation $\Delta v'$ of a second component of light emitted from the light emitting element through the first layer, the second layer and the encapsulation layer is a vertical axis and each of the variation $\Delta u'$ of the first component and the variation $\Delta v'$ of the second component in a square one is zero,
each of the variation $\Delta u'$ of the first component and the variation $\Delta v'$ of the second component has a negative value at viewing angles of 30°, 45° and 60°,
the variation $\Delta u'$ of the first component and the variation $\Delta v'$ of the second component decrease when the color coordinates are sequentially measured at a viewing angle from about 0° to about 30° and a viewing angle from about 30° to about 45°, and
the variation $\Delta u'$ of the first component and the variation $\Delta v'$ of the second component increase when the color coordinates are measured at a viewing angle from about 45° to about 60°.

19. The display device of claim 18, wherein, on the color coordinates,
a first point is defined at the viewing angle of about 0°,
a second point is defined at the viewing angle of about 30°, a third point is defined at the viewing angle of about 45°,
a first line is defined that connects the first point with the second point,
a second line is defined that connects the second point with the third point, and
each of the first line and the second line is linear.

20. The display device of claim 19, wherein, on the color coordinates,
a fourth point is defined at the viewing angle of about 60°,
a third line is defined that connects the third point with the fourth point, and
the third line is linear.

21. A display device, comprising:
a display electrode;
a first layer having a refractive index greater than or equal to about 1.7 and less than 2.2 and a thickness from about 5000 nm to about 15000 nm, the first layer disposed on the display electrode;
a second layer having a refractive index from about 1.25 to about 1.45 and a thickness from about 2000 nm to about 6000 nm, the second layer disposed on the first layer; and
an encapsulation layer disposed on the second layer,
wherein the encapsulation layer includes a lower inorganic encapsulation layer disposed on the second layer, an organic encapsulation layer disposed on the lower inorganic encapsulation layer, and an upper inorganic encapsulation layer disposed on the organic encapsulation layer,
wherein the lower inorganic encapsulation layer includes:
a first lower inorganic encapsulation layer with a third refractive index disposed on the second layer;
a second lower inorganic encapsulation layer with a fourth refractive index disposed on the first lower inorganic encapsulation layer;
a third lower inorganic encapsulation layer with a fifth refractive index disposed on the second lower inorganic encapsulation layer; and
a fourth lower inorganic encapsulation layer with a sixth refractive index disposed on the third lower inorganic encapsulation layer, wherein
the third refractive index is greater than the fourth refractive index,
the fourth refractive index is greater than the fifth refractive index, and
the fifth refractive index is greater than the sixth refractive index,
wherein the first lower inorganic encapsulation layer, the second lower inorganic encapsulation layer, the third lower inorganic encapsulation layer, and the fourth lower inorganic encapsulation layer are formed from a silicon oxynitride material, and an oxygen content in the silicon oxynitride material gradually increases whereas a nitrogen content in the silicon oxynitride material gradually decreases in a direction from the first lower inorganic encapsulation layer to the fourth lower inorganic encapsulation layer.

* * * * *